US012690474B2

(12) United States Patent
Miki

(10) Patent No.: US 12,690,474 B2
(45) Date of Patent: Jul. 21, 2026

(54) WIRING SUBSTRATE, SEMICONDUCTOR DEVICE, AND METHOD OF MANUFACTURING WIRING SUBSTRATE

(71) Applicant: SHINKO ELECTRIC INDUSTRIES CO., LTD., Nagano (JP)

(72) Inventor: Shota Miki, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 548 days.

(21) Appl. No.: 18/155,142

(22) Filed: Jan. 17, 2023

(65) Prior Publication Data

US 2023/0230911 A1 Jul. 20, 2023

(30) Foreign Application Priority Data

Jan. 19, 2022 (JP) ................................. 2022-006199

(51) Int. Cl.
| | |
|---|---|
| *H10W 70/60* | (2026.01) |
| *H10W 70/05* | (2026.01) |
| *H10W 90/00* | (2026.01) |
| *H10W 72/00* | (2026.01) |
| *H10W 72/20* | (2026.01) |
| *H10W 74/01* | (2026.01) |
| *H10W 74/15* | (2026.01) |

(52) U.S. Cl.
CPC .......... *H10W 70/611* (2026.01); *H10W 70/05* (2026.01); *H10W 90/401* (2026.01); *H10W 72/20* (2026.01); *H10W 72/851* (2026.01); *H10W 74/012* (2026.01); *H10W 74/15* (2026.01); *H10W 90/00* (2026.01)

(58) Field of Classification Search
CPC .......... H01L 23/5385; H01L 23/49833; H01L 23/28; H01L 23/31; H01L 23/3157; H01L 23/3192; H01L 23/5381; H01L 21/56; H01L 2225/06555; H01L 2225/06562; H01L 2224/73204; H05K 1/14–145; H10W 70/611–618; H10W 90/401
See application file for complete search history.

(56) References Cited

U.S. PATENT DOCUMENTS

| | | | | |
|---|---|---|---|---|
| 2010/0084175 A1* | 4/2010 | Suzuki | .............. | H01L 23/49822 |
| | | | | 174/260 |
| 2017/0263544 A1* | 9/2017 | Hiner | .................... | H01L 21/561 |
| 2020/0357744 A1* | 11/2020 | Yong | .................. | H01L 25/0655 |

FOREIGN PATENT DOCUMENTS

| | | |
|---|---|---|
| JP | H01-270239 | 10/1989 |
| JP | 8-55875 A | 2/1996 |
| JP | 2004-79658 A | 3/2004 |

OTHER PUBLICATIONS

Japanese Office Action mailed on May 27, 2025 issued in corresponding Japanese Application No. 2022-006199; English translation included; 7 pages.

* cited by examiner

*Primary Examiner* — Yu Chen
(74) *Attorney, Agent, or Firm* — Rankin, Hill & Clark LLP

(57) ABSTRACT

A wiring substrate has a first wiring substrate, plurality of second wiring substrates, and an adhesive layer. The plurality of second wiring substrates are arranged adjacent to each other on the first wiring substrate. The adhesive layer adheres the first wiring substrate and the plurality of second wiring substrates to each other. The adhesive layer has a filling portion that fills a groove portion formed by opposing of side surfaces of adjacent ones of the plurality of second wiring substrates.

13 Claims, 24 Drawing Sheets

WIRING SUBSTRATE, SEMICONDUCTOR DEVICE, AND METHOD OF MANUFACTURING WIRING SUBSTRATE

CROSS-REFERENCE TO RELATED APPLICATION

This application is based upon and claims the benefit of priority of the prior Japanese Patent Application No. 2022-006199, filed on Jan. 19, 2022, the entire contents of which are incorporated herein by reference.

FIELD

The embodiment discussed herein is related to a wiring substrate, semiconductor device, and a method of manufacturing the wiring substrate.

BACKGROUND

A stacked wiring substrate that includes relay substrates having fine wiring and stacked on a main substrate has been known conventionally, for example. In a case where a comparatively large semiconductor chip, for example, is mounted on such a stacked wiring substrate, the stacked wiring substrate may have plural relay substrates placed side by side and stacked on a single main substrate. That is, stacking the plural relay substrates, adjacent to each other, on the main substrate that is large enables: formation of the stacked wiring substrate that is large; and mounting of the large semiconductor chip on the stacked wiring substrate. Patent Literature 1: Japanese Laid-open Patent Publication. No. H01-270239

However, deformation of this stacked wiring substrate having the plural relay substrates stacked on the single main substrate, such as warpage of the main substrate, may cause a problem of damaging the relay substrates.

That is, for example, when a heat cycle test for evaluation of reliability of a stacked wiring substrate is performed, its main substrate may be deformed by thermal expansion and thermal contraction and may thereby be warped. When the main substrate is warped, facing side surfaces of adjacent ones of the relay substrates come close to each other. As a result, the facing side surfaces of the adjacent relay substrates may collide with each other and the relay substrates may thereby be damaged.

SUMMARY

According to an aspect of an embodiment, a wiring substrate includes a first wiring substrate; a plurality of second wiring substrates arranged adjacent to each other on the first wiring substrate; and an adhesive layer that adheres the first wiring substrate and the plurality of second wiring substrates to each other, wherein the adhesive layer has a filling portion that fills a groove portion formed by facing of side surfaces of adjacent ones of the plurality of second wiring substrates.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENT

An embodiment of a wiring substrate, a semiconductor device, and a method of manufacturing the wiring substrate that are disclosed by this application will hereinafter be described in detail on the basis of the drawings. Techniques disclosed herein are not limited by this embodiment.

Figure 1:
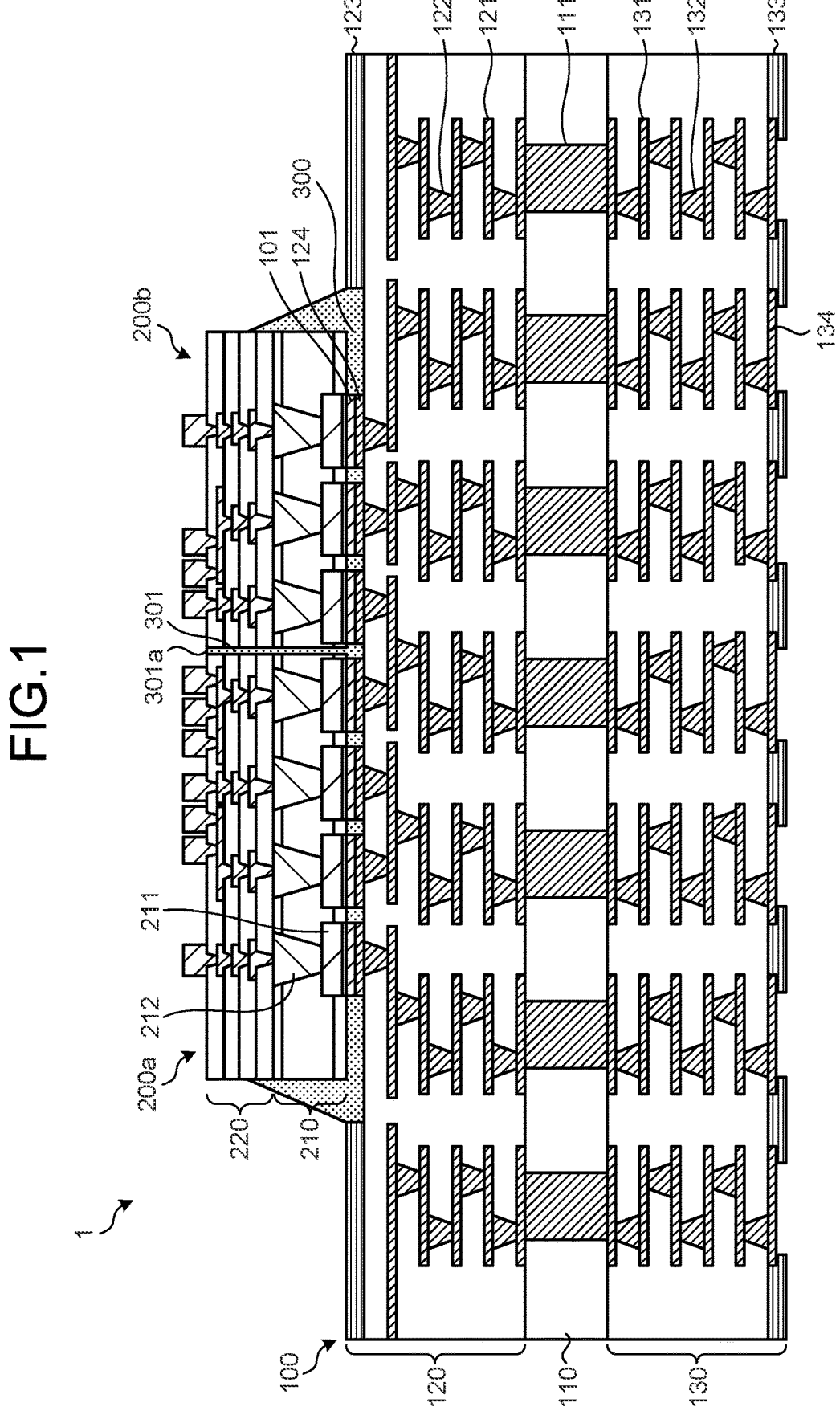
FIG. 1 is a diagram illustrating a structure of a substrate according to an embodiment.

FIG. 1 is a diagram illustrating a structure of a substrate 1 according to the embodiment. In FIG. 1, a cross section of the substrate 1 according to the embodiment is schematically illustrated. The substrate illustrated in FIG. 1 is a stacked wiring substrate that is obtained by: stacking plural relay substrates that have been placed side by side on a main substrate (an example of a first wiring substrate) 100, the plural relay substrates including relay substrates (an example of second wiring substrates) 200a and 200b; and adhering the main substrate 100 and the plural relay substrates to each other by means of an adhesive layer 300. In the following description, a direction heading from the main substrate 100 to the relay substrates 200a and 200b in FIG.

1 is upward and a direction heading from the relay substrates 200a and 200b to the main substrate 100 is downward. However, the main substrate 100 and the relay substrates 200a and 200b may be manufactured and used by being inverted vertically, for example, or may be manufactured and used in any posture.

The main substrate 100 has a core layer 110 and buildup layers 120 and 130.

The core layer 110 has wiring layers formed by plating, on both surfaces of an insulating base material. The wiring layers on these surfaces are connected by vias 111 as needed.

The buildup layer 120 is formed on an upper surface of the core layer 110, and has layers stacked over one another, each of the layers including an insulating layer made of buildup resin and a wiring layer 121 made of an electric conductor, for example. The wiring layers 121 are connected by vias 122. A surface of the buildup layer 120 is covered with a solder resist layer 123. In a region including positions where some of the vias 122 are exposed at the surface of the buildup layer 120, an opening is formed in the solder resist layer 123 and electrode pads 124 connected to these vias 122 are formed. The electrode pads 124 are formed of an electric conductor, for example, copper, and serve as connection terminals when the main substrate 100 is connected to the relay substrates 200a and 200b.

The buildup layer 130 is formed on a lower surface of the core layer 110, and has layers stacked over one another, each of the layers including an insulating layer made of buildup resin and a wiring layer 131 made of an electric conductor, for example. The wiring layers 131 are connected by vias 132. Furthermore, electrode pads 134 are formed of an electric conductor, for example, copper, on a surface of the buildup layer 130 and serve as connection terminals when the main substrate 100 is connected to an external component, such as a motherboard. The surface of the buildup layer 130 is covered with a solder resist layer 133 where the electrode pads 134 are exposed.

Each of the relay substrates 200a and 200b has a first wiring structure 210 serving as a base layer and a second wiring structure 220 having plural thin film layers stacked over one another. Electrode pads 211 are formed on the lower surfaces of the first wiring structures 210. The electrode pads 211 are formed of an electric conductor, for example, copper, and serve as connection terminals when the relay substrates 200a and 200b are connected to the main substrate 100. Furthermore, the electrode pads 211 are connected to wiring of the second wiring structures 220 via vias 212. The electrode pads 211 are connected by solder 101 to the electrode pads 124 that are the connection terminals of the main substrate 100, when the relay substrates 200a and 200b are mounted on the main substrate 100.

The relay substrates 200a and 200b are mounted on the main substrate 100 in a state of being adjacent to each other and are adhered to the main substrate 100. That is, the relay substrates 200a and 200b and the main substrate 100 are adhered to each other by the adhesive layer 300. Side surfaces of the relay substrates 200a and 200b adjacent to each other face each other to form a groove portion at a boundary portion between the relay substrates 200a and 200b. A filling portion 301 that is part of the adhesive layer 300 is formed in the groove portion.

The adhesive layer 300 is a layer made of thermosetting resin, for example, a non-conductive film (NCF), and adheres the relay substrates 200a and 200b and the main substrate 100 to each other. That is, the adhesive layer 300 is formed between lower surfaces of the plural relay substrates including the relay substrates 200a and 200b and an upper surface of the main substrate 100 and adheres the plural relay substrates and the main substrate 100 to each other. The part of the adhesive layer 300 fills the groove portion formed by the facing side surfaces of the adjacent relay substrates 200a and 200b and thereby forms the filling portion 301.

Filling the groove portion formed by the facing side surfaces of the adjacent relay substrates 200a and 200b with the filling portion 301 as described above protects the facing side surfaces of the adjacent relay substrates 200a and 200b. Therefore, even if deformation, such as warpage of the main substrate 100, is caused, the facing side surfaces of the adjacent relay substrates 200a and 200b will not collide with each other, and as a result, the relay substrates 200a and 200b will be prevented from being damaged.

Furthermore, an end face 301a of the filling portion 301 is positioned in the same plane as upper surfaces of the adjacent relay substrates 200a and 200b. As a result, when a semiconductor chip is mounted on the relay substrates 200a and 200b via underfill resin, the underfill resin is prevented from entering the groove portion formed by the facing side surfaces of the adjacent relay substrates 200a and 200b. Therefore, concentration of stress to the facing side surfaces of the adjacent relay substrates 200a and 200b is able to be minimized and cracks at these side surfaces are able to be minimized, the stress being based on a difference between thermal expansion coefficients of the underfill resin and the resin forming the adhesive layer 300.

Furthermore, the adhesive layer 300 adheres the relay substrates 200a and 200b and the main substrate 100 to each other in a state of covering part of non-facing side surfaces of the adjacent relay substrates 200a and 200b, the non-facing side surfaces not facing each other. All of the side surfaces of the adjacent relay substrates 200a and 200b are thereby covered with the adhesive layer 300 or the filling portion 301. Therefore, stress acting on the relay substrates 200a and 200b upon mounting of the semiconductor chip on the relay substrates 200a and 200b is evenly distributed from the side surfaces of the relay substrates 200a and 200b to the adhesive layer 300. As a result, damage to the relay substrates 200a and 200b due to stress concentration is able to be minimized.

A method of manufacturing the substrate 1 configured as described above will be described next. A method of manufacturing the main substrate 100 and a method of manufacturing the relay substrates 200a and 200b will hereinafter be described, and thereafter, the method of manufacturing the substrate 1, which has the main substrate 100 and the relay substrates 200a and 200b, will be described.

Figure 2:
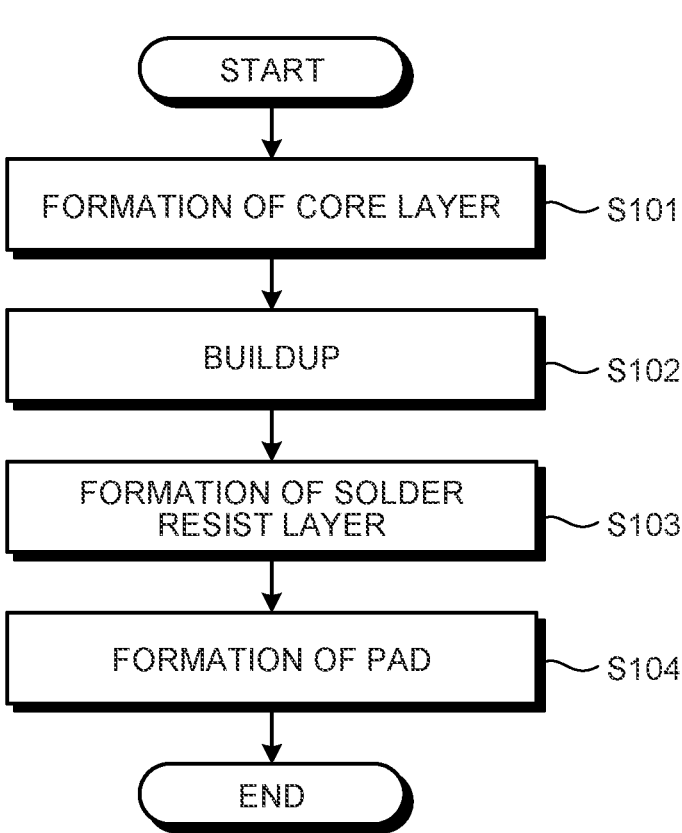
FIG. 2 is a flowchart illustrating a method of manufacturing a main substrate.

FIG. 2 is a flowchart illustrating the method of manufacturing the main substrate 100.

Figure 3:
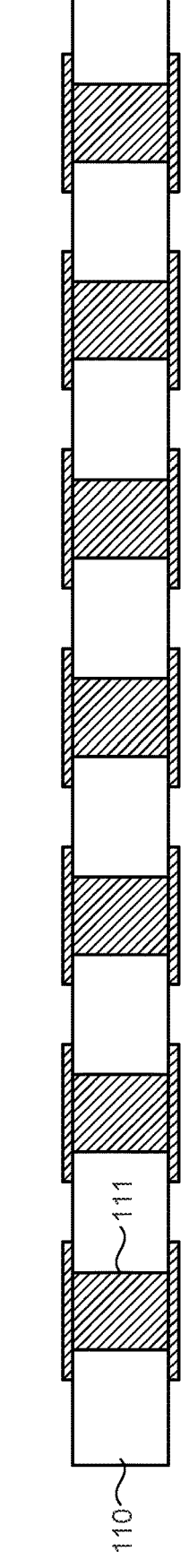
FIG. 3 is a diagram illustrating a specific example of a core layer formation process.

Firstly, the core layer 110 serving as a support member for the main substrate 100 is formed (Step S101). Specifically, as illustrated in FIG. 3, for example, the vias 111 penetrating the insulating base material are formed in the insulating base material and metal layers of, for examine, copper, are formed on both surfaces of the insulating base material. FIG. 3 is a diagram illustrating a specific example of a core layer formation process. The wiring layers on both surfaces of the base material are connected by the vias 111 as needed.

Figure 4:
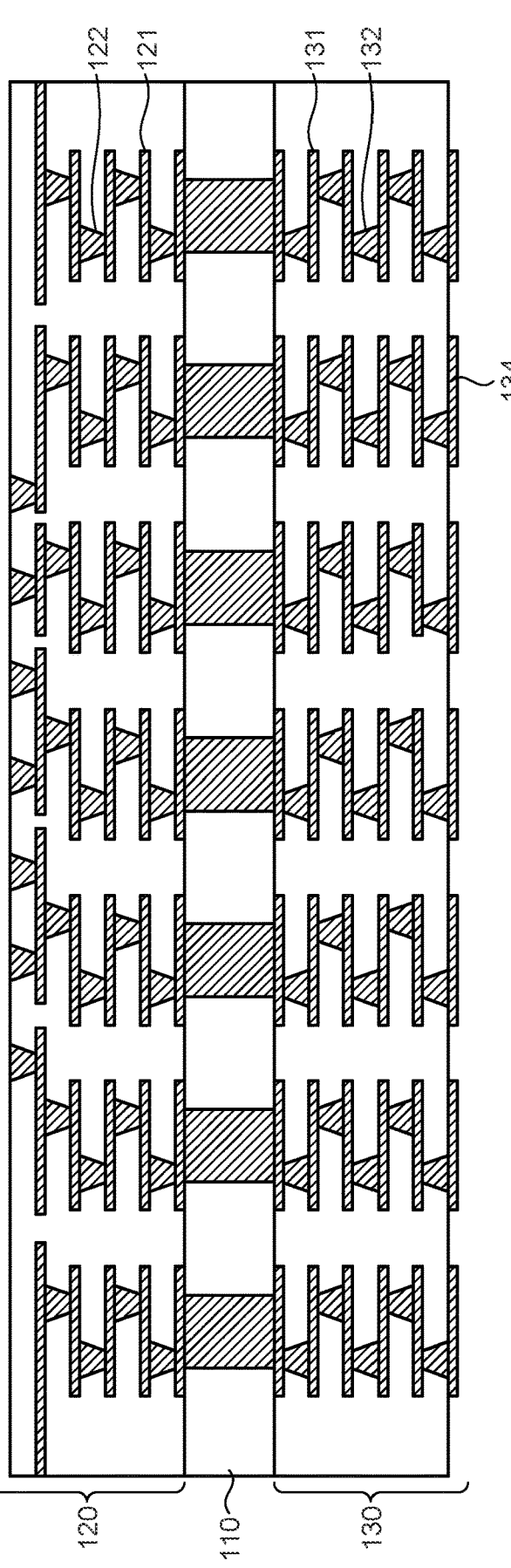
FIG. 4 is a diagram illustrating a specific example of a buildup process.

The buildup layers 120 and 130 are then formed respectively on the upper surface and lower surface of the core layer 110 by the buildup technique (Step S102). Specifically, as illustrated in FIG. 4, for example, the buildup layer 120 is formed on the upper surface of the core layer 110 by stacking of the layers over one another, the layers each having the insulating layer and the wiring layer 121. FIG. 4 is a diagram illustrating a specific example of a buildup process. The wiring layers 121 are connected by the vias 122 penetrating the insulating layers. Furthermore, the buildup layer 130 is formed on the lower surface of the core layer 110 by stacking of the layers over one another, the layers each including the insulating layer and the wiring layer 131. The wiring layers 131 are connected by the vias 132 penetrating the insulating layers. In addition, the electrode pads 134 are formed on the surface of the buildup layer 130. The insulating layers are formed using insulating resin, for example, epoxy resin or polyimide resin. Furthermore, the wiring layers 121 and 131, vias 122 and 132, and electrode pads 134 are formed by plating with metal, for example, copper.

Figure 5:
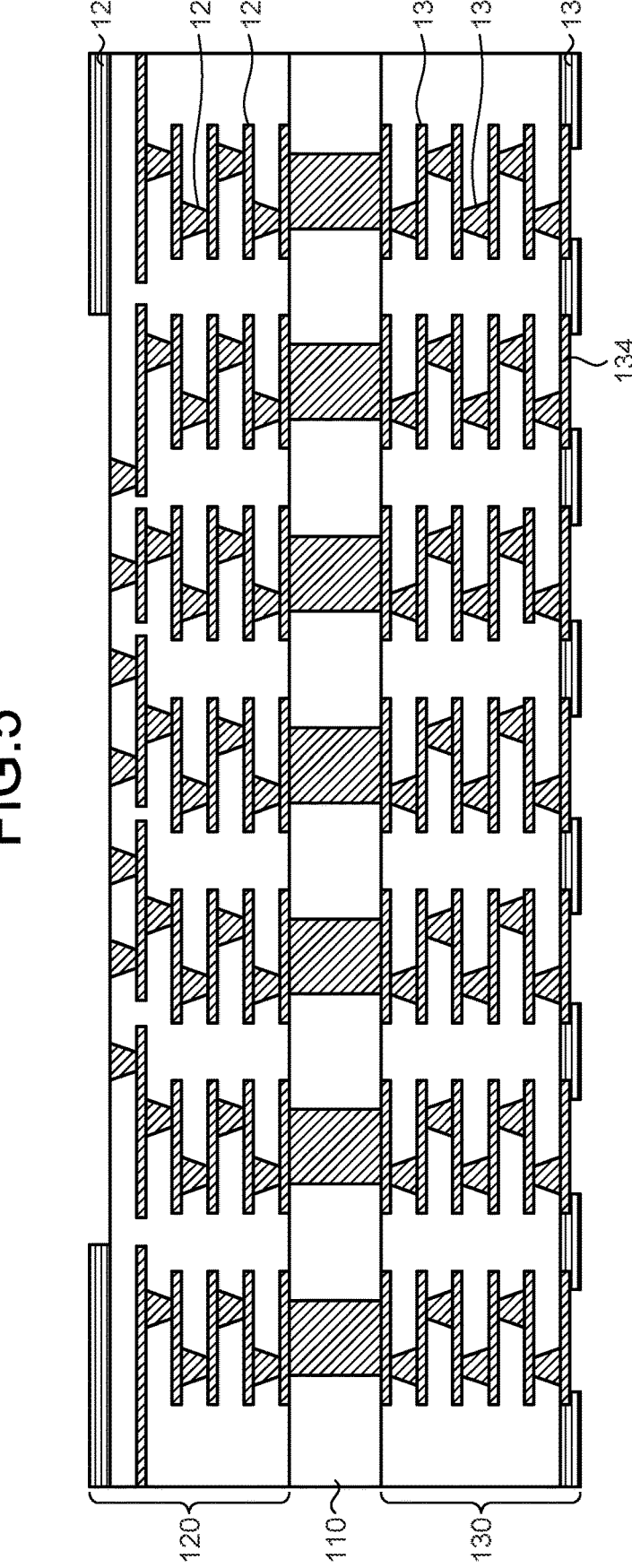
FIG. 5 is a diagram illustrating a specific example of a solder resist layer formation process.

The solder resist layers 123 and 133 are then formed on the surfaces of the buildup layers 120 and 130 (Step S103). That is, as illustrated in FIG. 5, the face of the buildup layer 120 is covered with the solder resist layer 123, and the surface of the buildup layer 130 is covered with the solder resist layer 133. FIG. 5 is a diagram illustrating a specific example of a solder resist layer formation process. In the region including the positions corresponding to the vias 122 in the uppermost layer of the buildup layer 120, the opening is formed in the solder resist layer 123. That is, upper surfaces of these vias 122 are exposed from the opening in the solder resist layer 123. At positions corresponding to the electrode pads 134 on the buildup layer 130, openings are formed in the solder resist layer 133. That is, the electrode pads 134 are exposed from these openings in the solder resist layer 133.

Figure 6:
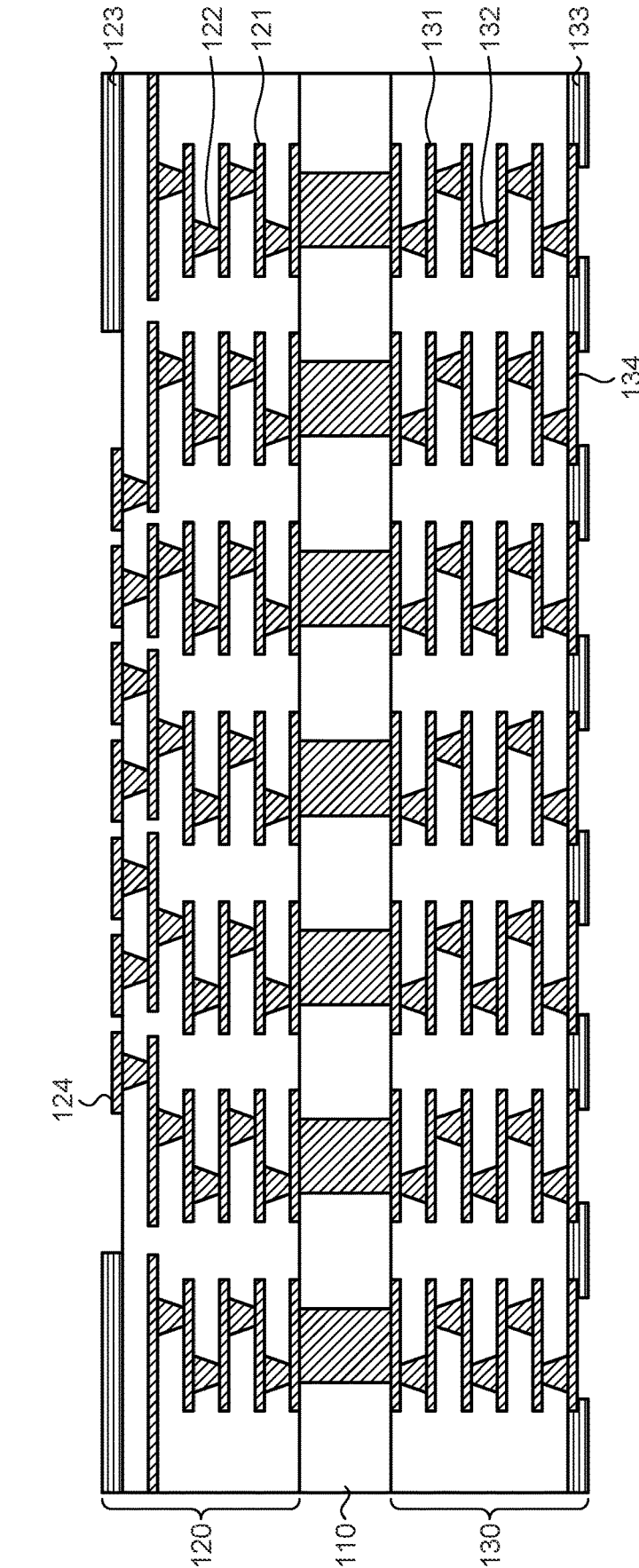
FIG. 6 is a diagram illustrating a specific example of a pad formation process.

Subsequently, at the positions where the upper surfaces of the vias 122 in the uppermost layer of the buildup layer 120 are exposed at the opening in the solder resist layer 123, the connection terminals for connection between the main substrate 100 and the relay substrates 200a and 200b are formed (Step S104). That is, as illustrated in FIG. 6, for example, at the positions where the upper surfaces of the vias 122 in the uppermost layer of the buildup layer 120 are exposed, the electrode pads 124 that are the connection terminals are formed by copper plating, for example. FIG. 6 is a diagram illustrating a specific example of a pad formation process. By formation of the electrode pads 124, the main substrate 100 forming a lower layer of the substrate 1 is obtained.

Figure 7:
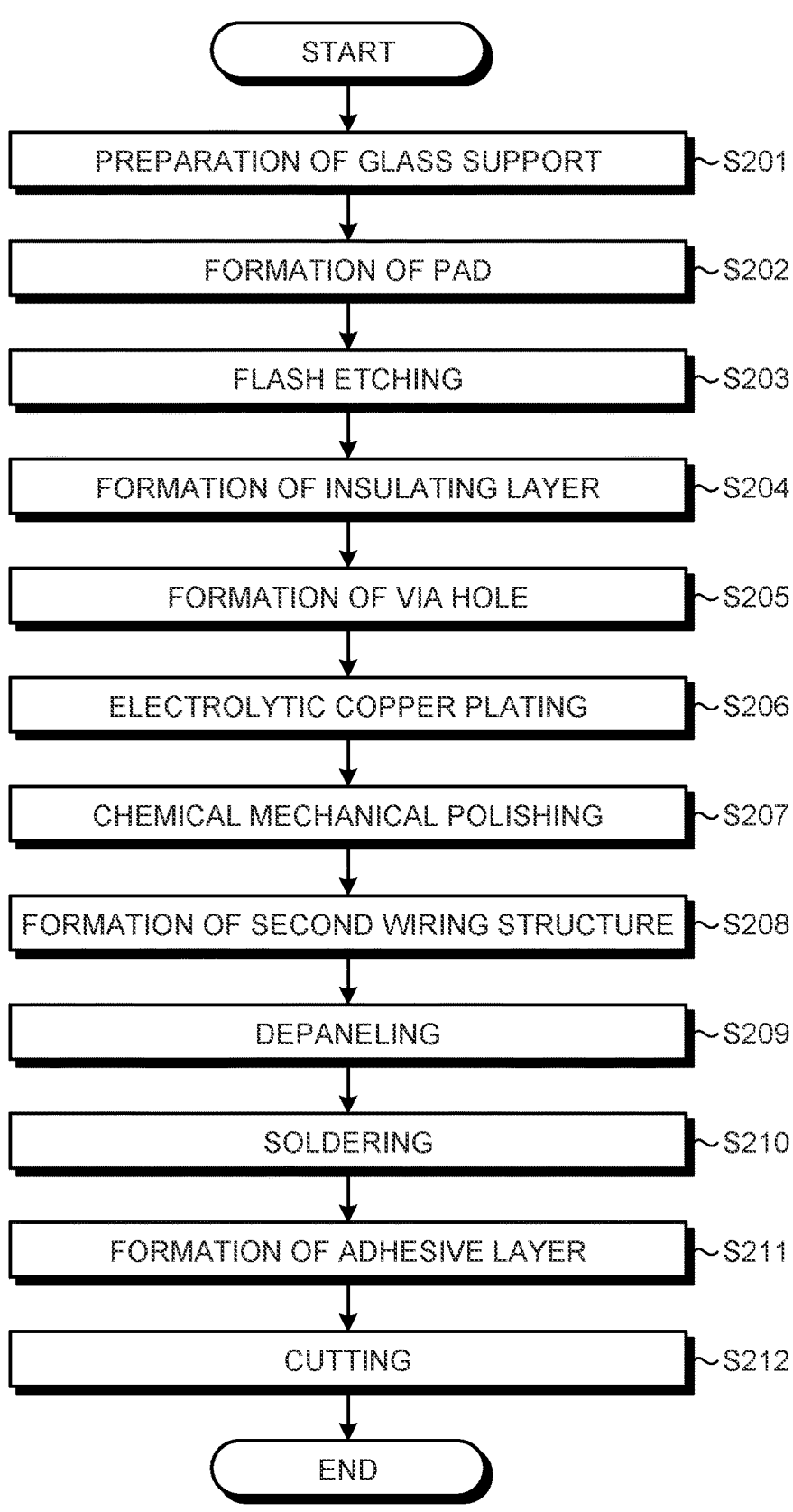
FIG. 7 is a flowchart illustrating a method of manufacturing a relay substrate.

Next, FIG. 7 is a flowchart illustrating a method of manufacturing the relay substrates 200a and 200b.

Figure 8:
FIG. 8 is a diagram illustrating a specific example of a glass support.

Firstly, a glass support 400 serving as a support for manufacture of the relay substrates 200a and 200b is prepared (Step S201). Specifically, as illustrated in FIG. 8, for example, a peeling layer 401, a first metal layer 402, and a second metal layer 403 are formed in order on a flat upper surface of the glass support 400. FIG. 8 is a diagram illustrating a specific example of the glass support 400. The first metal layer 402 is formed by sputtering of titanium, for example, and the second metal layer 403 is formed by sputtering of copper, for example. The example where the glass support 400 is used as the support for manufacture of the relay substrates 200a and 200b has been described herein, but a support formed of a material that is able to be used in conveyance process, such as a core material or a metal plate, may be used instead of the glass support 400.

Figure 9:
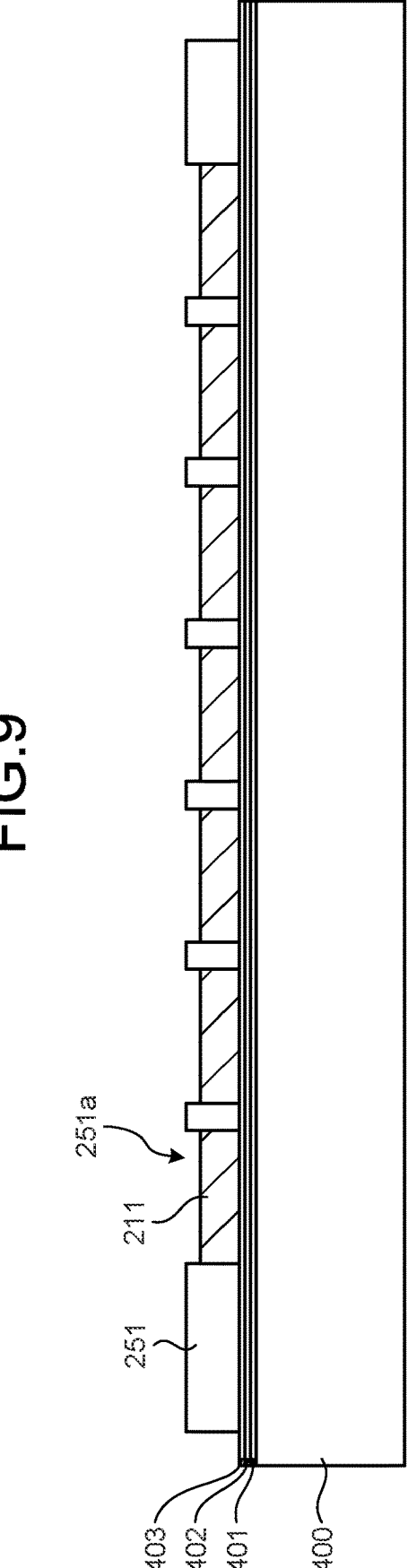
FIG. 9 is a diagram illustrating a specific example of a pad formation process.

The electrode pads 211 are then formed above the second metal layer 403 (Step S202). Specifically, as illustrated in FIG. 9, for example, a resist layer 251 having openings 251a is formed on the second metal layer 403, and the electrode pads 211 are formed by electrolytic plating on the second metal layer 403 exposed at the openings 251a. FIG. 9 is a diagram illustrating a specific example of a pad formation process. The resist layer 251 is formed using a dry film resist, for example, and the openings 251a are able to be formed by photolithography or laser processing, for example.

Figure 10:
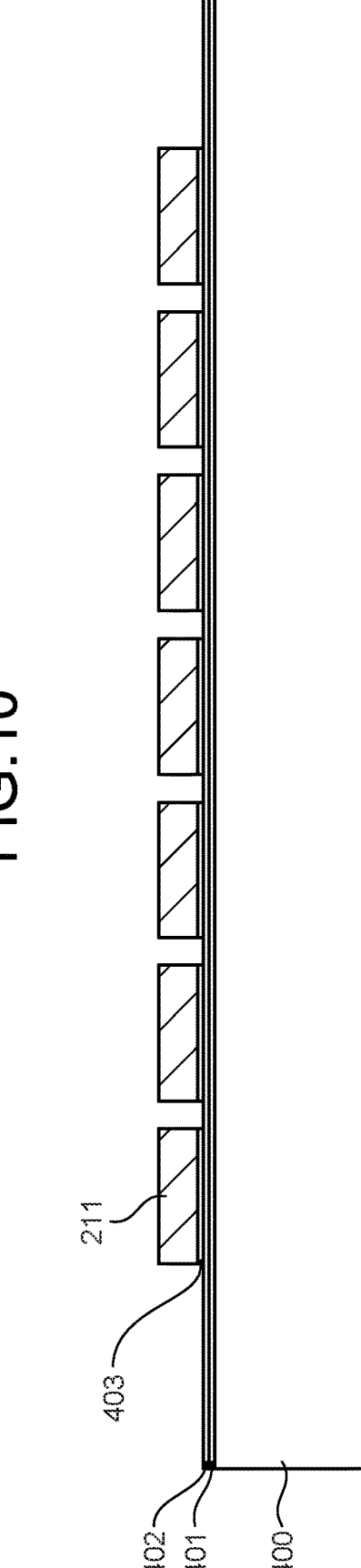
FIG. 10 is a diagram illustrating a specific example of a flash etching process.

Subsequently, the resist layer 251 is removed and unnecessary portions of the second metal layer 403 are removed by flash etching (Step S203). Specifically, the portions of the second metal layer 403 are dissolved by etching liquid that dissolves the second metal layer 403, the portions being exposed without being in contact with the electrode pads 211. As illustrated in FIG. 10, for example, the first metal layer 402 is exposed at the portions other than contacting portions of the second metal layer 403, the contacting portions being in contact with the electrode pads 211. FIG. 10 is a diagram illustrating a specific example of a flash etching process.

Figure 11:
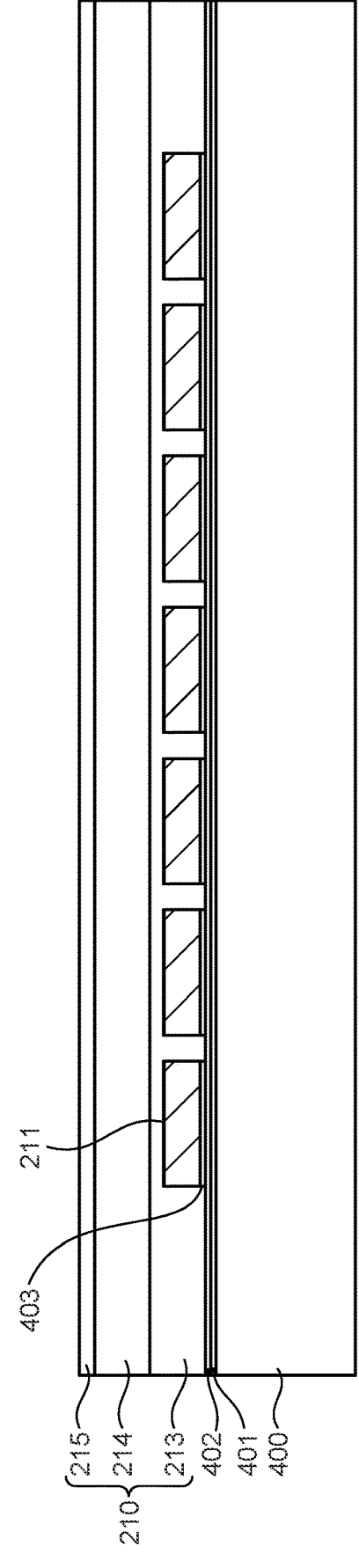
FIG. 11 is a diagram illustrating a specific example of an insulating layer formation process.

When the electrode pads 211 have been formed, an insulating layer of the first wiring structure 210 is formed on the first metal layer 402, the insulating layer covering the electrode pads 211 (Step S204). That is, as illustrated in FIG. 11, for example, a first insulating layer 213, a second insulating layer 214, and a third insulating layer 215 that are in a semi-cured state are stacked in order on the first metal layer 402 and the electrode pads 211 are thereby covered with the first insulating layer 213 and the second insulating layer 214. FIG. 11 is a diagram illustrating a specific example of an insulating layer formation process. The first insulating layer 213 is formed using is resin that is cured by thermal curing, for example, epoxy resin or polyimide resin. The second insulating layer 214 is stacked above and adjacent to the first insulating layer 213 and is formed by impregnation of a reinforcement member, such as glass fiber, with insulating resin. Inclusion of the reinforcement member in the second insulating layer 214 improves strength of the relay substrates 200a and 200b. The insulating resin that the reinforcement member of the second insulating layer 214 is impregnated with is resin that is cured by thermal curing, for example, epoxy resin or polyimide resin. The third insulating layer 215 is stacked above and adjacent to the second insulating layer 214 and is formed using insulating resin that is cured by thermal curing, for example, epoxy resin or polyimide resin. The insulating layer formed on the first metal layer 402 is then thermally cured.

Figure 12:
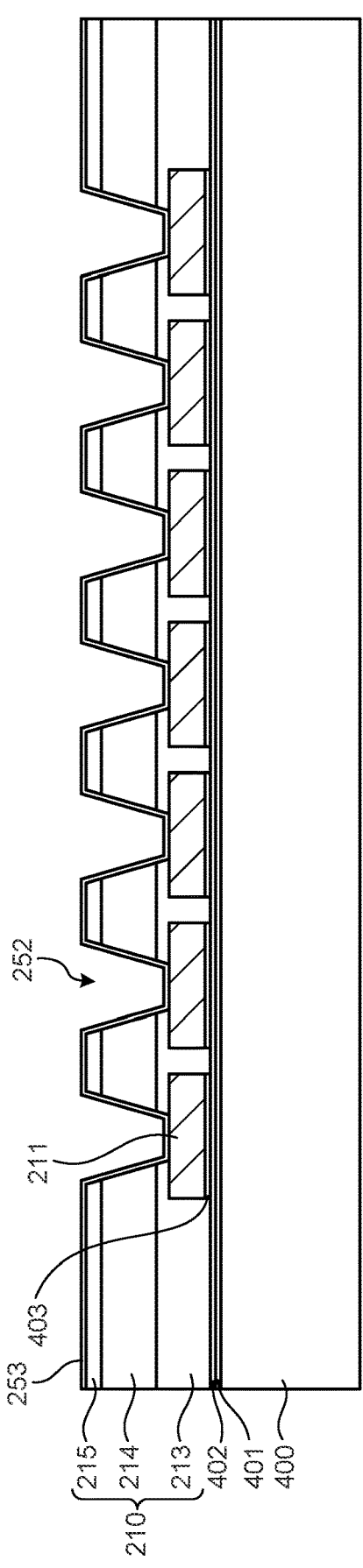
FIG. 12 is a diagram illustrating a specific example of a via hole formation process.

Via holes are then formed in the first wiring structure 210 (Step S205). Specifically, as illustrated in FIG. 12, for example, via holes 252 penetrating the second insulating layer 214 and the third insulating layer 215 and exposing upper surfaces of the electrode pads 211 are formed. FIG. 12 is a diagram illustrating a specific example of a via hole formation process. The via holes 252 are able to be formed by, for example, laser processing. Smears of the insulating resin are removed by desmearing, the smears being generated by the laser processing, and electroless copper plating 253 is formed on a surface of the first wiring structure 210.

Figure 13:
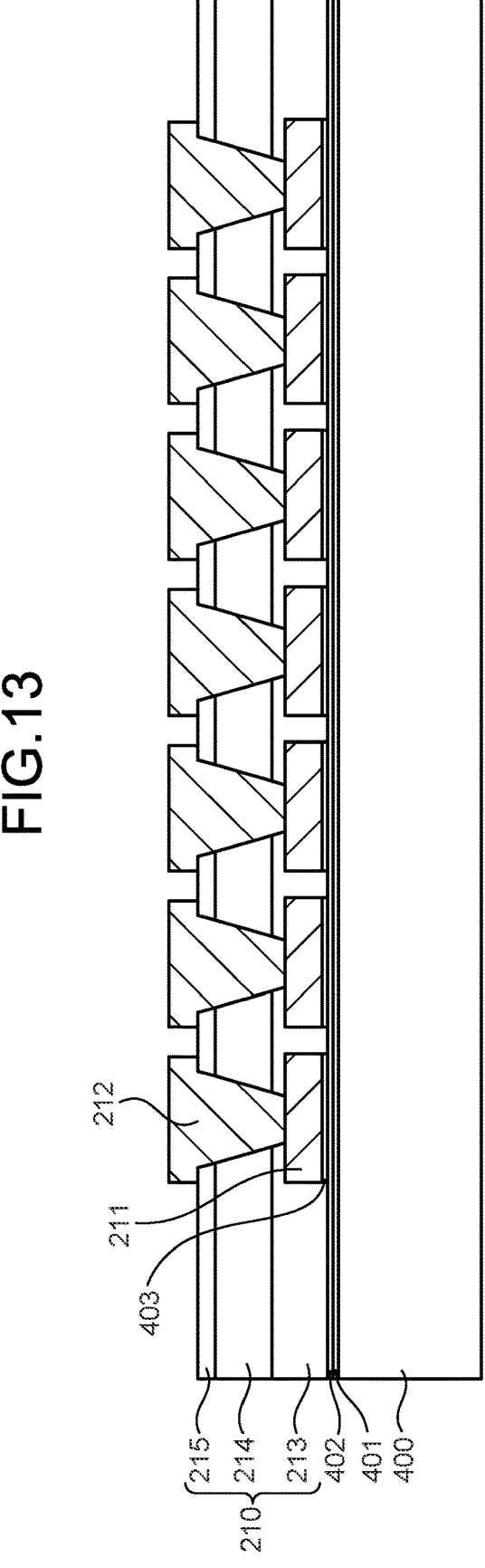
FIG. 13 is a diagram illustrating a specific example of an electrolytic copper plating process.

When the via holes 252 have been formed, electrolytic copper plating is performed for formation of the vias 212 in the first wiring structure 210 (Step S206). That is, a resist layer having openings at positions of the via holes 252 is formed on an upper surface of the first wiring structure 210 (that is, an upper surface of the third insulating layer 215), and electrolytic copper plating is performed by immersion of the whole intermediate structure stacked on the glass support 400 in a plating solution. As illustrated in FIG. 13, for example, the via holes 252 are thereby filled with electrolytic copper and the vias 212 are thereby formed. FIG. 13 is a diagram illustrating a specific example of an electrolytic copper plating process. After the electrolytic copper plating, the resist layer having the openings at the positions of the vias 212 is removed, and the electroless copper plating 253 that has been in contact with the resist layer is removed by flash etching. The electroless copper plating 253 in contact with the vias 212 remain after the flash etching but illustration thereof has been omitted in FIG. 13.

Figure 14:
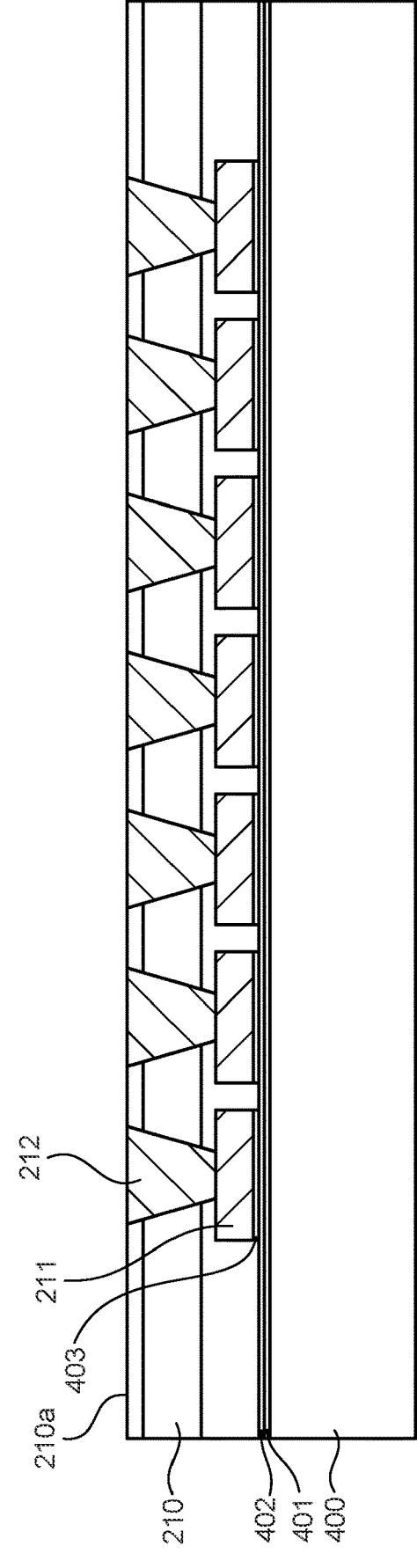
FIG. 14 is a diagram illustrating a specific example of a chemical mechanical polishing process.

By chemical mechanical polishing (CMP) on an upper surface of the intermediate structure (Step S207), the first wiring structure 210 is completed. Specifically, as illustrated in FIG. 14, for example, the first wiring structure 210 having an upper surface 210a that is flat is produced on the glass support 400 by CMP. FIG. 14 is a diagram illustrating a specific example of a chemical mechanical polishing process.

Figure 15:
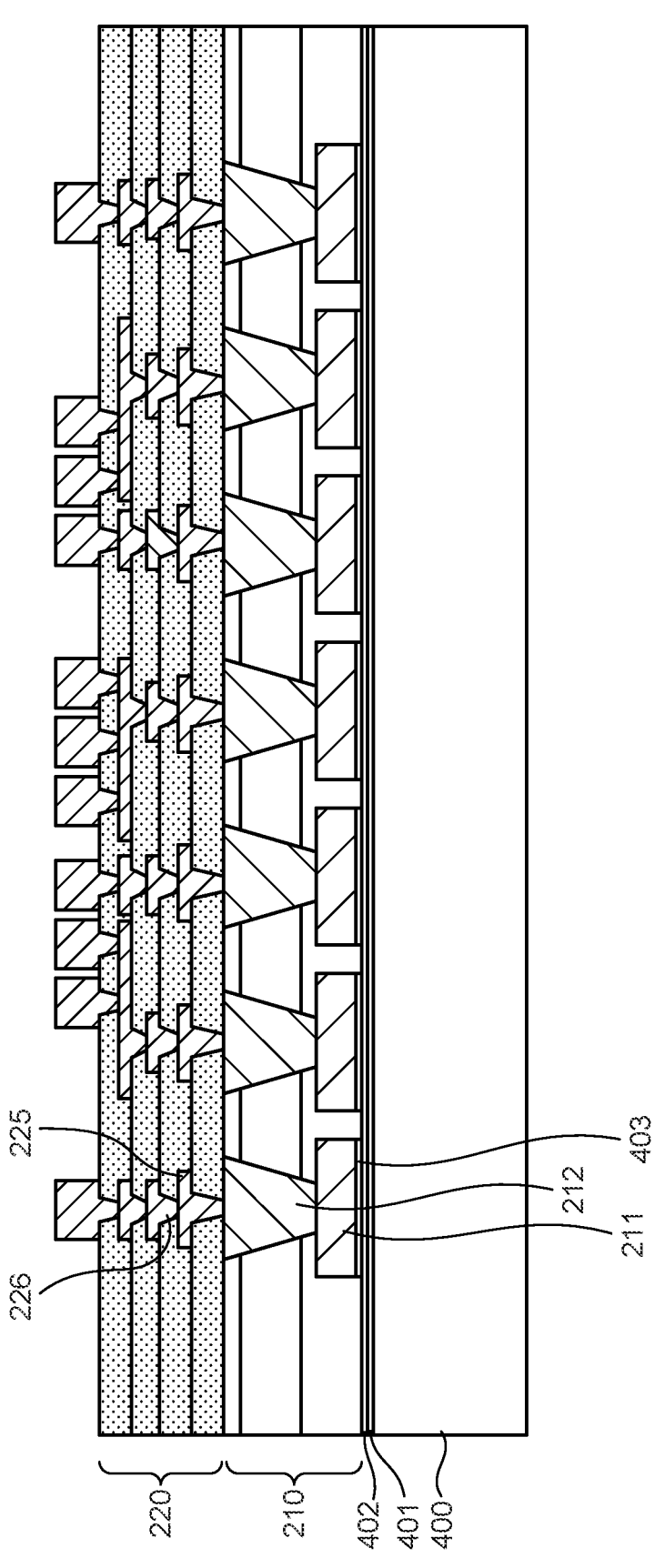
FIG. 15 is a diagram illustrating a specific example of a second wiring structure formation process.

When the first wiring structure 210 has been completed, the second wiring structure 220 is formed on the upper surface 210a of the first wiring structure 210 (Step S208). That is, as illustrated in FIG. 15, for example, four thin film layers are stacked in order on the first wiring structure 210 by the buildup technique, and the second wiring structure 220 having wiring layers 225 including fine wiring is thereby formed. FIG. 15 is a diagram illustrating a specific example of a second wiring structure formation process. The second wiring structure 220 herein is formed by stacking of the four thin film layers on the upper surface 210a of the first wiring structure 210, but the number of the thin film layers stacked on the upper surface 210a of the first wiring structure 210 may be not necessarily four. The four thin film layers are each a thin film layer formed by formation of the wiring layer 225 on an insulating layer, the wiring layer 225 including fine wiring. The wiring layers 225 of the four thin film layers are connected to each other by vias 226 respectively penetrating the insulating layers.

Figure 16:
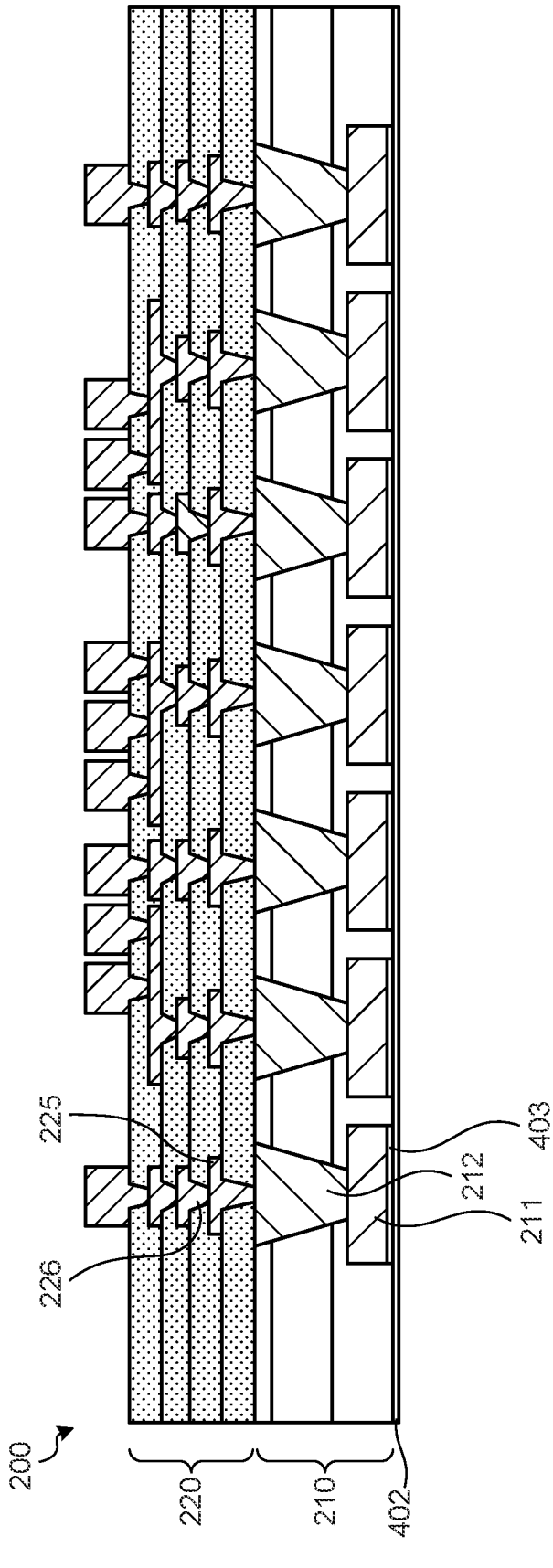
FIG. 16 is a diagram illustrating a configuration of an assembly of relay substrates that has been depaneled.

The intermediate structure having the first wiring structure 210 and the second wiring structure 220 formed on the glass support 400 is obtained by the processes described thus far. The first wiring structure 210 and the second wiring structure 220 form an assembly including the relay substrates 200a and 200b. By the first wiring structure 210 and the second wiring structure 220 being depaneled from the intermediate structure (Step S209), the assembly including the relay substrates 200a and 200b is obtained. Specifically, as illustrated in FIG. 16, for example, layers of the intermediate structure are peeled away from the peeling layer 401, and an assembly 200 including the relay substrates 200a and 200b is thereby obtained, the layers including the first metal layer 402 and above the metal layer 402. FIG. 16 is a diagram illustrating a configuration of the assembly 200 of the relay substrates 200a and 200b that has been depaneled.

Figure 17:
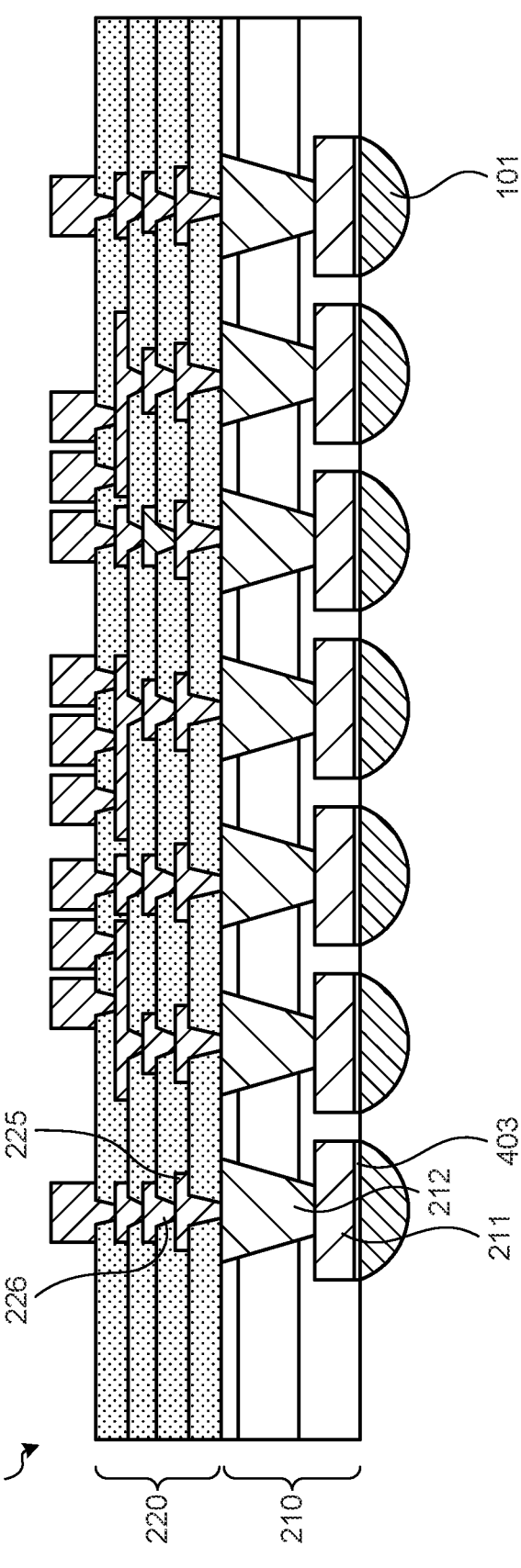
FIG. 17 is a diagram illustrating a specific example of a soldering process.

Subsequently, as illustrated in FIG. 17, for example, solder 101 is applied to the electrode pads 211 after the first metal layer 402 has been removed (Step S210). FIG. 17 is a diagram illustrating a specific example of a soldering process.

Figure 18:
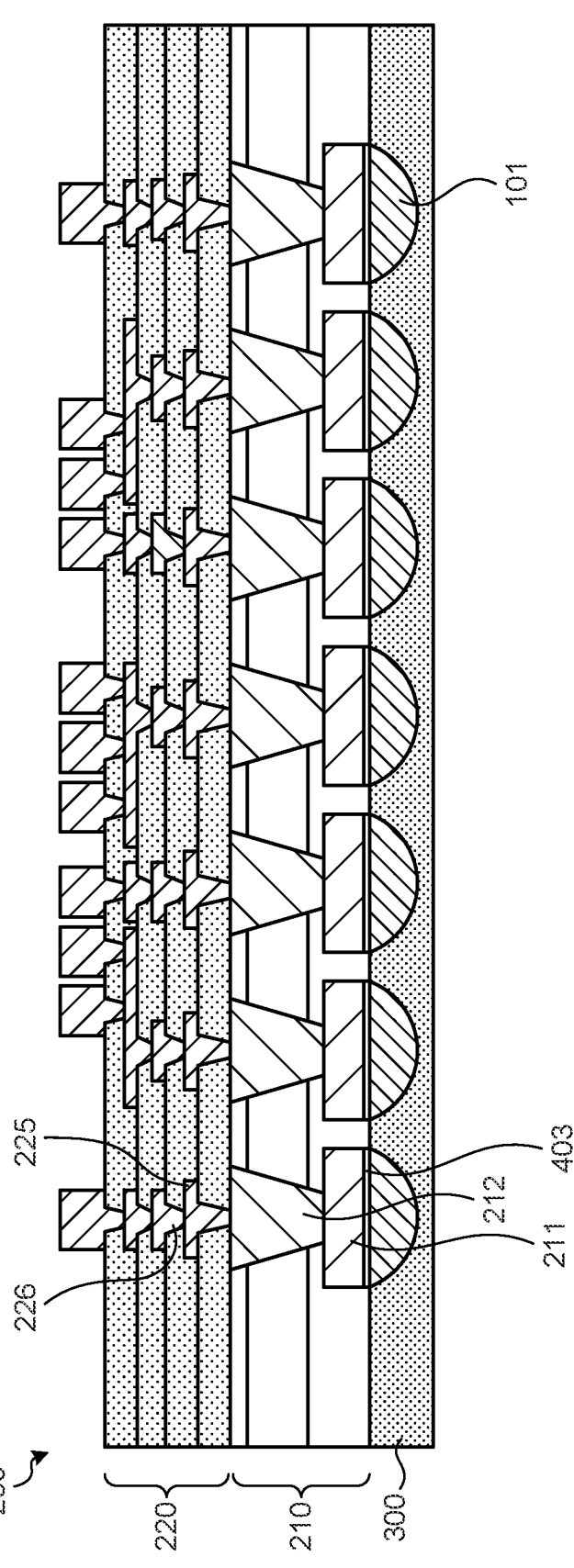
FIG. 18 is u diagram illustrating a specific example of an adhesive layer formation process.

When the solder 101 has been applied to the electrode pads 211, the adhesive layer 300 that covers the solder 101 is formed on a lower surface of the assembly 200 (that is, the lower surface of the first wiring structure 210) including the relay substrates 200a and 200b (Step S211). That is, as illustrated in FIG. 18, for example, the adhesive layer 300 that has not been cured yet is stacked on the lower surface of the assembly 200 including the relay substrates 200a and 200b, and the solder 101 is thereby covered by the adhesive layer 300 that has not been cured yet. FIG. 18 is a diagram illustrating a specific example of an adhesive layer formation process.

Figure 19:
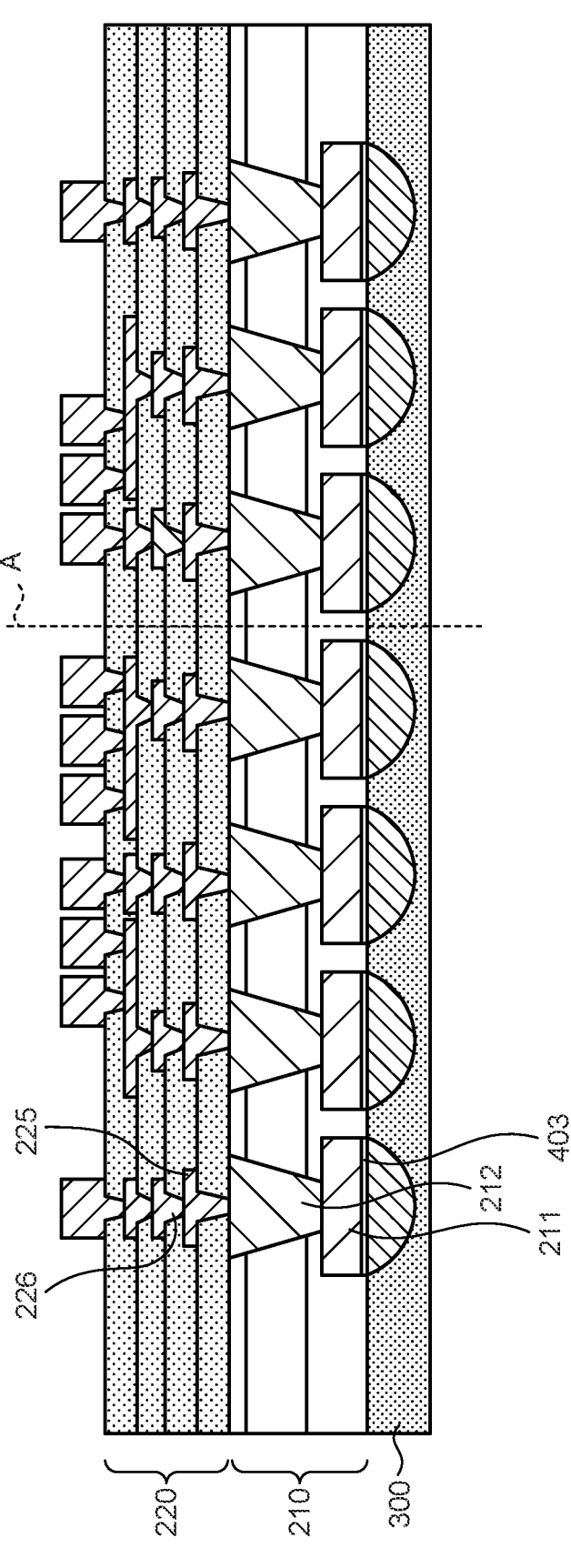
FIG. 19 is diagram illustrating a specific example of a cutting process.

When the adhesive layer 300 has been formed, the assembly 200 including the relay substrates 200a and 200b is cut by, for example, a dicer or a slicer (Step S212) to be separated into the relay substrates 200a and 200b having appropriate sizes. That is, as illustrated in FIG. 19, for example, by the assembly 200 being cut along a cut line A prescribing the relay substrates 200a and 200b, plural relay substrates including the relay substrates 200a and 200b forming an upper layer of the substrate 1 are obtained. FIG. 19 is a diagram illustrating a specific example of a cutting process.

Figure 20:
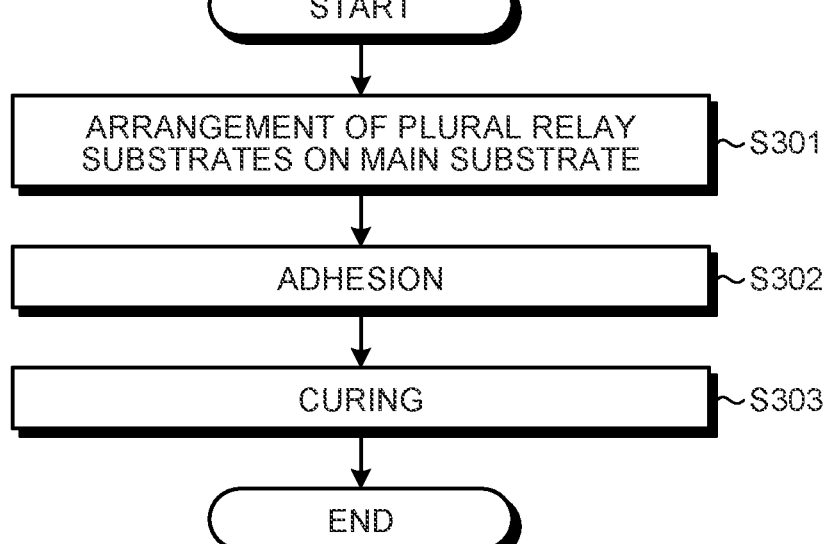
FIG. 20 is a flowchart illustrating a method of manufacturing the substrate.

Next, FIG. 20 is a flowchart illustrating a method of manufacturing the substrate 1. The substrate 1 is manufactured using the main substrate 100 and the relay substrates 200a and 200b described above.

Figure 21:
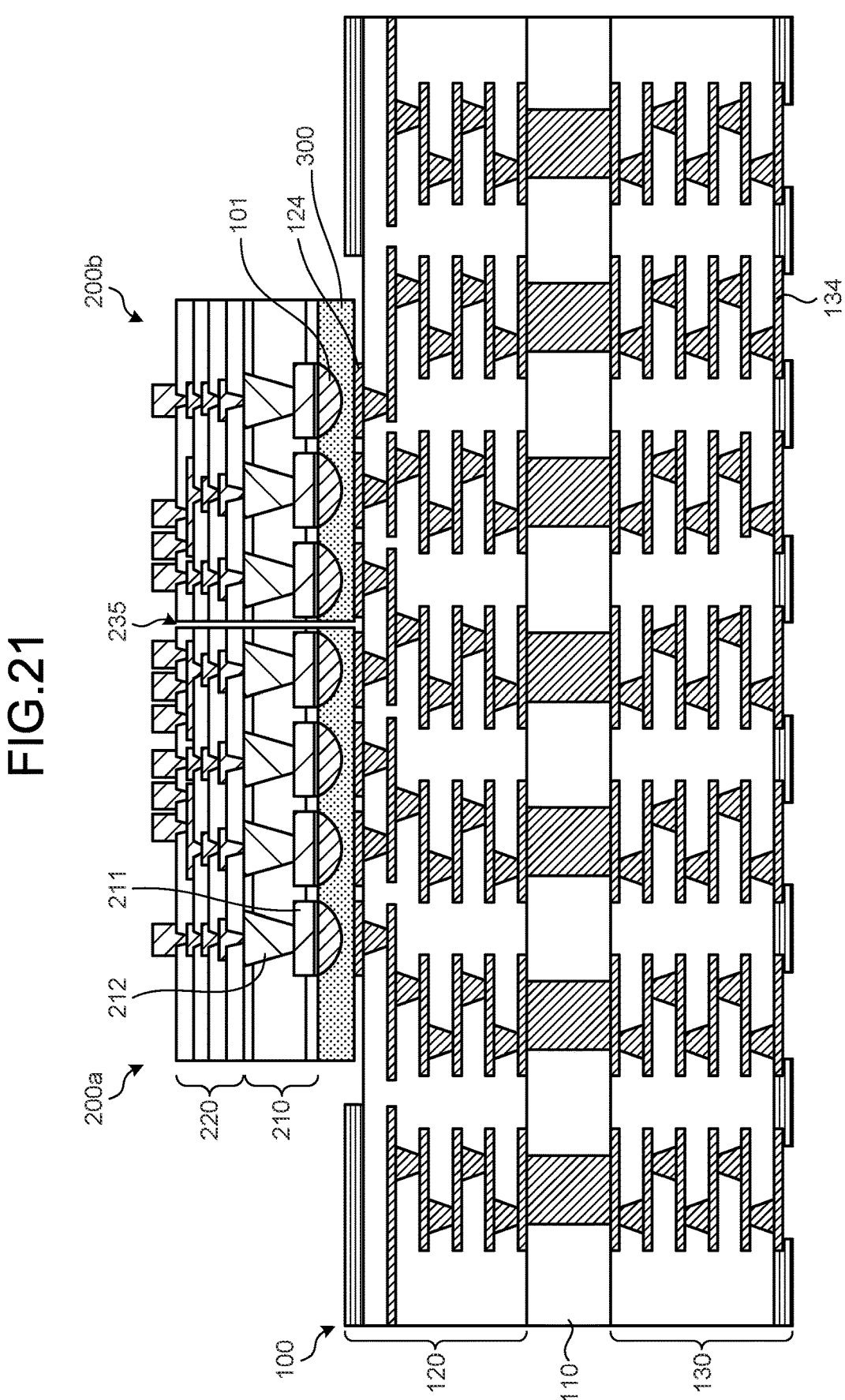
FIG. 21 is a diagram illustrating a specific example of a relay substrate mounting process.

Firstly, plural relay substrates are mounted on the main substrate 100 via the adhesive layer 300 that has not been cured yet (Step S301). Specifically, as illustrated in FIG. 21, for example, plural relay substrates having the adhesive layer 300 formed on their lower surfaces and including the relay substrates 200a and 200b are mounted on the main substrate 100 side by side via the adhesive layer 300 that has not been cured yet. When they are mounted, they are positioned such that solder 101 that has been applied to the electrode pads 211 of the relay substrates 200a and 200b faces the electrode pads 124 of the main substrate 100. FIG. 21 is a diagram illustrating a specific example of a relay substrate mounting process. The adjacent relay substrates 200a and 200b are mounted on the main substrate 100 with an interval between the relay substrates 200a and 200b, and a groove portion 235 is formed by the facing side surfaces of the relay substrates 200a and 200b. That is, in a state where the plural relay substrates including the relay substrates 200a and 200b have been mounted on the main substrate 100, the groove portion 235 is formed at the boundary portion between the adjacent relay substrates 200a and 200b.

Figure 22:
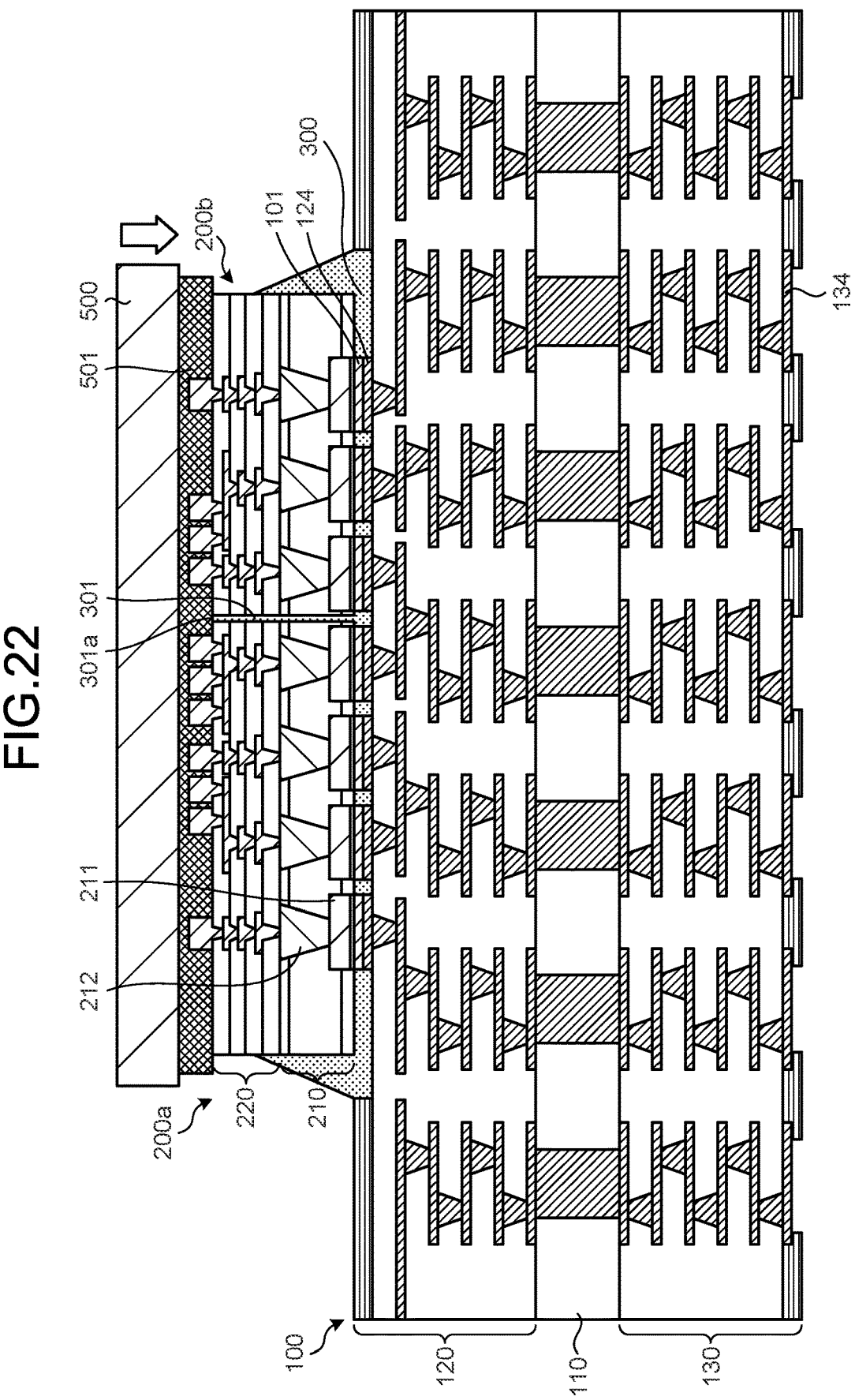
FIG. 22 is a diagram illustrating a specific example of an adhesion process.

Subsequently, the plural relay substrates including the relay substrates 200a and 200b are adhered onto the main substrate 100 by the adhesive layer 300 (Step S302). Specifically, firstly, a release film 501 is stacked on the upper surfaces of the relay substrates 200a and 200b to cover an opening of the groove portion 235. Subsequently, as illustrated in FIG. 22, for example, pressing the release film 501 from above with a pressing plate 500 adheres the relay substrates 200a and 200b to the upper surface of the main substrate 100 by means of the adhesive layer 300. In this adhesion, the adhesive layer 300 interposed between the main substrate 100 and the relay substrates 200a and 200b is extruded to a region around the relay substrates 200a and 200b to cover part of the non-facing side surfaces of the adjacent relay substrates 200a and 200b and to thereby form fillets. Furthermore, the groove portion 235 is filled with part of the adhesive layer 300 and the filling portion 301 is thereby formed. The filling portion 301 seals the boundary portion between the adjacent relay substrates 200a and 200b and protects the facing side surfaces of the adjacent relay substrates 200a and 200b. Therefore, even if deformation, such as warpage of the main substrate 100, is caused, the facing side surfaces of the adjacent relay substrates 200a and 200b do not collide with each other, and as a result, the relay substrates 200a and 200b are prevented from being damaged. FIG. 22 is a diagram illustrating a specific example of an adhesion process.

Furthermore, as illustrated in FIG. 22, the filling portion 301 that is part of the adhesive layer 300 reaches the release film 501 positioned in the same plane as the upper surfaces of the adjacent relay substrates 200a and 200b. That is, the end face 301a of the filling portion 301 is positioned in the same plane as the upper surfaces of the adjacent relay substrates 200a and 200b. As a result, when a semiconductor chip is mounted on the relay substrates 200a and 200b via underfill resin, the underfill resin is prevented from entering the groove portion formed by the facing side surfaces of the adjacent relay substrates 200a and 200b.

Furthermore, the adhesive layer 300 has a thermal expansion coefficient lower than that of the insulating resin forming the insulating layers of the second wiring structures 220 in the relay substrates 200a and 200b. For example, the insulating resin forming the insulating layers of the second wiring structures 220 has a thermal expansion coefficient of 40 to 70 (ppm/° C.) and the adhesive layer 300 has a thermal expansion coefficient of 20 to 40 (ppm/° C.). The thermal expansion coefficient of the adhesive layer 300 being lower than the thermal expansion coefficient of the insulating resin forming the insulating layers of the second wiring structures 220 minimizes thermal expansion and thermal contraction of the adhesive layer 300 and enables minimization of stress concentration to the relay substrates 200a and 200b from the adhesive layer 300. In addition, the adhesive layer 300 has an elastic modulus higher than that of the insulating resin forming the insulating layers of the second wiring structures 220 in the relay substrates 200a and 200b. For example, the elastic modulus of the insulating resin forming the insulating layers of the second wiring structures 220 is 2 to 4 (GPa) and the elastic modulus of the adhesive layer 300 is 6 to 9 (GPa). The elastic modulus of the adhesive layer 300 being higher than the elastic modulus of the insulating resin forming the insulating layers of the second wiring structures 220 enables relaxation of the stress on the facing side surfaces of the relay substrates 200a and 200b.

Figure 23:
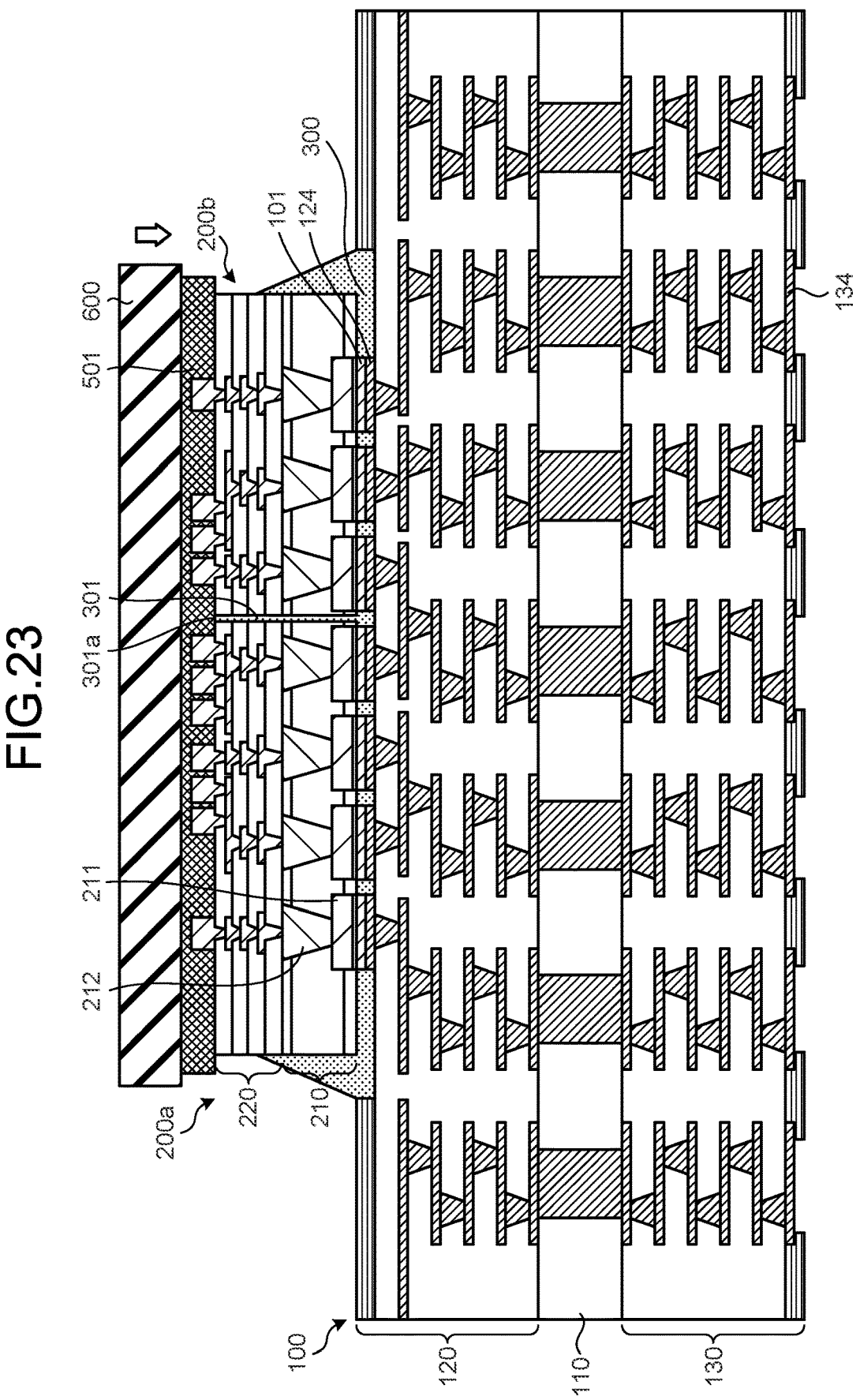
FIG. 23 is a diagram illustrating a specific example of a curing process.

When the plural relay substrates including the relay substrates 200a and 200b have been adhered, the adhesive layer 300 is thermally cured (Step S303). Specifically, as illustrated in FIG. 23, for example, pressing and heating the release film 501 from above by means of a pressing plate 600 that is an elastic body in a state where the opening of the groove portion 235 has been covered with the release film 501 causes the adhesive layer 300 to be thermally cured. FIG. 23 is a diagram illustrating a specific example of a curing process. When the adhesive layer 300 is thermal cured, the pressing plate 600 is heated to a temperature equal to or higher than the melting point of the solder 101 that has been applied to the electrode pads 211 of the relay substrates 200a and 200b. The solder 101 is thereby molten, and the electrode pads 211 of the relay substrates 200a and 200b and the electrode pads 124 of the main substrate 100 are respectively bonded to each other by the solder 101. When thermal curing of the adhesive layer 300 and bonding by the solder 101 have been completed, e release film 501 is removed. The substrate 1 is thereby completed.

Figure 24:
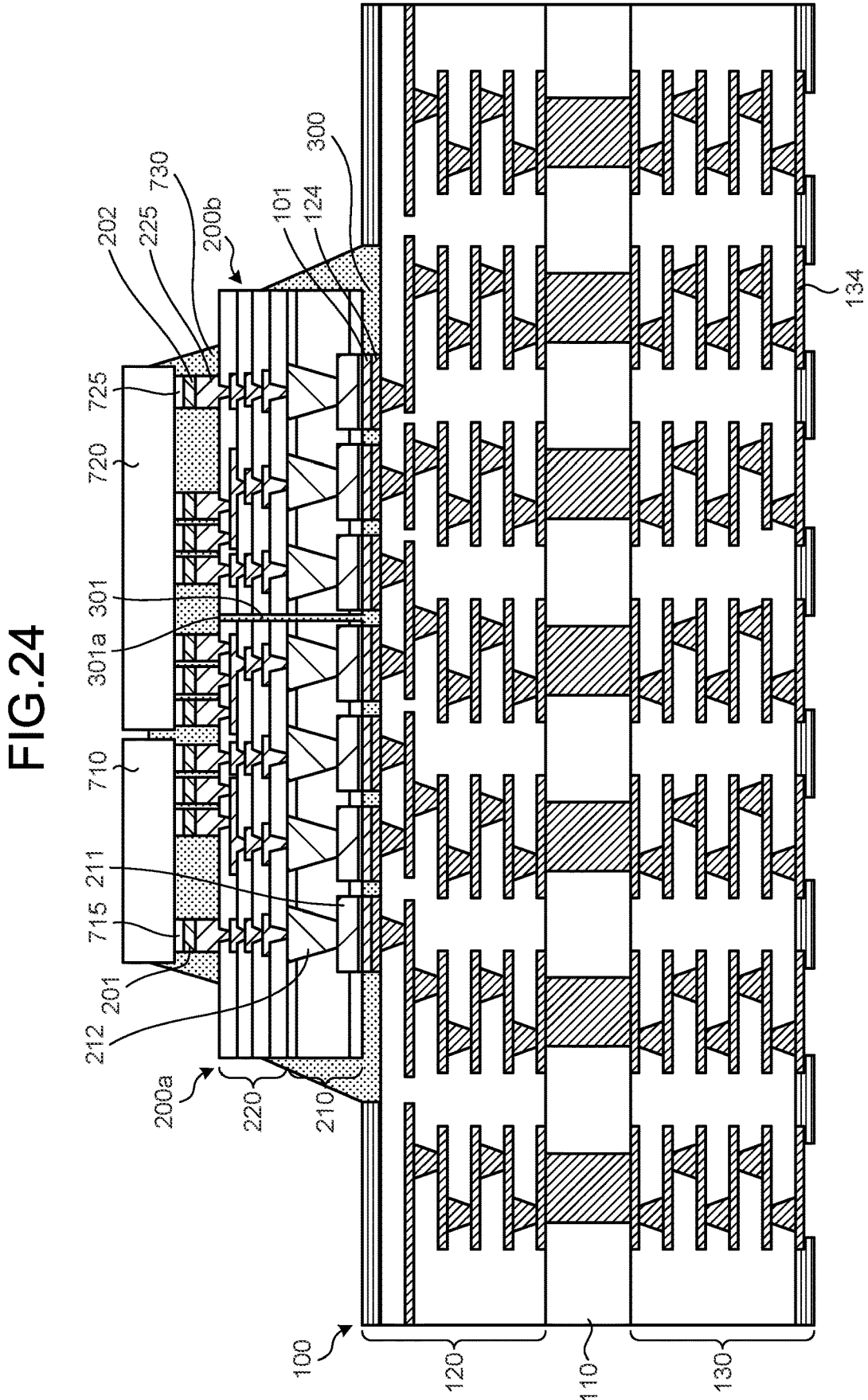
FIG. 24 is u diagram illustrating an example of a configuration of a semiconductor device.

The substrate 1 may be used in, for example, a semiconductor device having a component, such as a semiconductor chip, mounted thereon. Specifically, as illustrated in FIG. 24, semiconductor chips 710 and 720 are mounted on an upper surface of the substrate 1 (that is, the upper surfaces of the relay substrates 200a and 200b). The semiconductor chip 710 is mounted on the upper surface of the re substrate 200a. FIG. 24 is a diagram illustrating an example of a configuration of the semiconductor device. That is, electrodes 715 of the semiconductor chip 710 and the wiring layer 225 positioned in the uppermost layer of the relay substrate 200a are bonded to each other by solder 201. Furthermore, the semiconductor chip 720 is mounted across the upper surfaces of the adjacent relay substrates 200a and 200b and the end face 301a of the filling portion 301. That is, electrodes 725 of the semiconductor chip 720 and the wiring layer 225 positioned in the uppermost layer of the relay substrate 200a are bonded to each other by solder 201, and the electrodes 725 of the semiconductor chip 720 and the wiring layer 225 positioned in the uppermost layer of the relay substrate 200b are bonded to each other by solder 202. Joints between the electrodes 715 and the wiring layer 225 and joints between the electrodes 725 and the wiring layer 225 are sealed by underfill resin 730. The semiconductor device having the semiconductor chips 710 and 720 mounted on the relay substrates 200a and 200b via the underfill resin 730 is thereby obtained.

When the semiconductor chips 710 and 720 are mounted via the underfill resin 730, the end face 301a of the filling portion 301 is in the same plane as the upper surfaces of the relay substrates 200a and 200b, and the underfill resin 730 thus does not enter the boundary portion between the relay substrates 200a and 200b. Therefore, concentration of stress to the facing side surfaces of the adjacent relay substrates 200a and 200b is able to be minimized, the stress being based on the difference between the thermal expansion coefficients of the underfill resin 730 and the resin forming the adhesive layer 300. As a result, cracks at the facing side surfaces of the adjacent relay substrates 200a and 200b are able to be minimized.

As described above, a wiring substrate according to the embodiment (for example, the substrate 1) has a first wiring substrate (for example, the main substrate 100), plural second wiring substrates (for example, the relay substrates 200a and 200b), and an adhesive layer (for example, the adhesive layer 300). The plural second wiring substrates are arranged adjacent to each other on the first wiring substrate. The adhesive layer adheres the first wiring substrate and the plural second wiring substrates to each other. The adhesive layer has a filling portion (for example, the filling portion 301) that fills a groove portion (for example, the groove portion 235) formed by facing of side surfaces of the adjacent second wiring substrates. The wiring substrate according to the embodiment thereby enables minimization of damage to the wiring substrate.

Furthermore, the filling portion may have an end face (for example, the end face 301a) positioned in the same plane as upper surfaces of the adjacent second wiring substrates. As a result, when a semiconductor chip (for example, the semiconductor chips 710 and 720) is mounted on the wring substrate according to the embodiment via underfill resin (for example, the underfill resin 730), the underfill resin does not enter a boundary portion between the adjacent second wiring substrates.

Furthermore, the second wiring substrates may each have a wiring structure (for example, a second wiring structure 220) including a wiring layer and an insulating layer that have been stacked over each other. The adhesive layer may have a thermal expansion coefficient lower than that of insulating resin forming the insulating layers of the wiring structures. Thermal expansion and thermal contraction of the adhesive layer are thereby minimized and the wiring substrate according to the embodiment thereby enables minimization of stress concentration to the second wiring substrates from the adhesive layer.

Furthermore, the adhesive layer may adhere the first wiring substrate and the plural second wiring substrates to each other in a state of covering part of non-facing side surfaces of the adjacent second wiring substrates, the non-facing side surfaces not facing each other. The wiring substrate according to the embodiment thereby enables minimization of occurrence of damage to the second wiring substrates due to stress concentration.

According to an aspect of a wiring substrate disclosed by this application, occurrence of damage to the wiring substrate is able to be minimized.

All examples and conditional language recited herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

Note (1). A method of manufacturing a wiring substrate, including:

mounting a plurality of second wiring substrates adjacent to each other on a first wiring substrate via an adhesive layer that has not been cured;

adhering the plurality of second wiring substrates onto the first wiring substrate by the adhesive layer; and curing the adhesive layer, wherein the adhering includes filling a groove portion with part of the adhesive layer, the groove portion being formed by facing of side surfaces of adjacent ones of the plurality of second wiring substrates.

(2). The method of manufacturing the wiring substrate, according to the note (1), wherein the adhering includes stacking a release film on upper surfaces of the plurality of second wiring substrates to cover as opening of the groove portion and pressing the release film to fill the groove portion with the part of the adhesive layer and cause the part of the adhesive layer to reach the release film positioned in a same planes as the upper surfaces of the adjacent second wiring substrates.

What is claimed is:

1. A wiring substrate, comprising:

a first wiring substrate;

a plurality of second wiring substrates arranged adjacent to each other on the first wiring substrate; and an adhesive layer that adheres the first wiring substrate and the plurality of second wiring substrates to each other, wherein each of the plurality of second wiring substrates has a wiring structure including a plurality of wiring layers and a plurality of insulating layers stacked over each other alternately, each of the plurality of insulating layers being composed of insulating resin, the adhesive layer has a filling portion that fills a groove portion formed by facing of side surfaces of adjacent ones of the plurality of second wiring substrates, the filling portion has an end face positioned in a same plane as an upper surface of an uppermost insulating layer of the plurality of insulating layers included in the wiring structure of each of the adjacent ones of the plurality of second wiring substrates, the adhesive layer has a covering portion that covers a part of side surfaces of the adjacent ones of the plurality of second wiring substrates, the side surfaces not facing each other, and the end face is higher from the first wiring substrate than an uppermost end of the covering portion.

2. The wiring substrate according to claim 1, wherein the adhesive layer has a thermal expansion coefficient lower than that of the insulating resin forming each of the plurality of insulating layers of the wiring structure of each of the plurality of second wiring substrates.

3. The wiring substrate according to claim 2, wherein the thermal expansion coefficient of the insulating resin is 40 to 70 (ppm/° C.), and the thermal expansion coefficient of the adhesive layer is 20 to 40 (ppm/° C.).

4. The wiring substrate according to claim 1, wherein the adhesive layer adheres the first wiring substrate and the plurality of second wiring substrates to each other in a state of covering at least a part of side surfaces of the adjacent ones of the plurality of second wiring substrates, the side surfaces not facing each other.

5. The wiring substrate according to claim 4, wherein the adhesive layer has another filling portion that fills a space between the first wiring substrate and the plurality of second wiring substrates, and the filling portion, the another filling portion, and the covering portion are integrally formed.

6. The wiring substrate according to claim 1, wherein the first wiring substrate has a first electrode pad on a surface opposed to each of the plurality of second wiring substrates, each of the plurality of second wiring substrates has a second electrode pad on a surface opposed to the first wiring substrate, and the first electrode pad and the second electrode pad are connected by a solder.

7. The wiring substrate according to claim 1, wherein the adhesive layer has an elastic modulus higher than that of the insulating resin forming each of the plurality of insulating layer layers of the wiring structure of each of the plurality of second wiring substrates.

8. The wiring substrate according to claim 7, wherein the elastic modulus of the insulating resin is 2 to 4 (GPa), and the elastic modulus of the adhesive layer is 6 to 9 (GPa).

9. The wiring substrate according to claim 1, wherein the end face is positioned in the same plane as the upper surface of the uppermost insulating layer, the same plane being lower than an upper surface of an uppermost wiring layer of the plurality of wiring layers included in the wiring structure of each of the adjacent ones of the plurality of second wiring substrates.

10. A semiconductor device, comprising:

a wiring substrate; and a semiconductor chip mounted on the wiring substrate, wherein the wiring substrate comprises:

a first wiring substrate;

a plurality of second wiring substrates arranged adjacent to each other on the first wiring substrate; and an adhesive layer that adheres the first wiring substrate and the plurality of second wiring substrates to each other, wherein each of the plurality of second wiring substrates has a wiring structure including a plurality of wiring layers and a plurality of insulating layers stacked over each other alternately, each of the plurality of insulating layers being composed of insulating resin, the adhesive layer has a filling portion that fills a groove portion formed by facing of side surfaces of adjacent ones of the plurality of second wiring substrates, and the filling portion has an end face positioned in a same plane as an upper surface of an uppermost insulating layer of the plurality of insulating layers included in the wiring structure of each of the adjacent ones of the plurality of second wiring substrates, the adhesive layer has a covering portion that covers a part of side surfaces of the adjacent ones of the plurality of second wiring substrates, the side surfaces not facing each other, and the end face is higher from the first wiring substrate than an uppermost end of the covering portion.

11. The semiconductor device according to claim 10, wherein the semiconductor chip is mounted across the upper surfaces of the adjacent ones of the plurality of second wiring substrates and the end face of the filling portion.

12. The semiconductor device according to claim 11, further comprising an underfill resin that is disposed between the plurality of second wiring substrates and the semiconductor chip, covers the upper surfaces of the adjacent ones of the plurality of second wiring substrates and the end face of the filling portion, and does not enter the groove.

13. The semiconductor device according to claim 10, wherein the end face is positioned in the same plane as the upper surface of the uppermost insulating layer, the same plane being lower than an upper surface of an uppermost wiring layer of the plurality of wiring layers included in the wiring structure of each of the adjacent ones of the plurality of second wiring substrates.

\* \* \* \* \*